United States Patent [19]

Malocha et al.

[11] 4,035,675
[45] July 12, 1977

[54] CAPACITIVE TAP WEIGHTED SURFACE ACOUSTIC WAVE TRANSDUCERS

[75] Inventors: Donald C. Malocha, Urbana; Bill J. Hunsinger, Mahomet, both of Ill.

[73] Assignee: University of Illinois Foundation, Urbana, Ill.

[21] Appl. No.: 675,134

[22] Filed: Apr. 8, 1976

[51] Int. Cl.$^2$ .............. H01L 41/04; H03H 9/30
[52] U.S. Cl. ........................... 310/9.8; 333/30 R
[58] Field of Search ............ 310/8.1, 9.7, 9.8; 333/30 R, 72

[56] References Cited

U.S. PATENT DOCUMENTS

| | | | |
|---|---|---|---|
| 3,621,482 | 11/1971 | Adler | 333/30 R X |
| 3,686,518 | 8/1972 | Hartmann et al. | 310/9.8 |
| 3,689,784 | 9/1972 | De Klerk | 310/9.8 |
| 3,825,779 | 7/1974 | De Klerk | 310/9.8 |
| 3,894,251 | 7/1975 | Shibayama et al. | 310/9.8 |

Primary Examiner—Mark O. Budd
Attorney, Agent, or Firm—Martin Novack

[57] ABSTRACT

A transducer for a surface acoustic wave device. In accordance with an embodiment of the invention, there is provided an acoustic wave propagating substrate and first and second spaced elongated conductive fingers disposed on the substrate. A layer of dielectric material is formed over the first and second fingers. A first electrode is formed on the dielectric layer above the first finger, the first electrode being proportioned to oppose a predetermined portion of the first finger. A second electrode is formed on the dielectric layer above the first finger, the second electrode being spaced from the first electrode and proportioned to oppose another predetermined portion of the first finger. A third electrode is formed on the dielectric layer above the second finger, the third electrode being proportioned to oppose a predetermined portion of the second finger. A fourth electrode is formed on the dielectric layer above the second finger, the fourth electrode being proportioned to oppose another predetermined portion of the second finger. A plurality of input/output (i.e., input or output) terminals are provided, and means are provided for coupling the input/output terminals to the electrodes.

17 Claims, 9 Drawing Figures

CAPACITIVE TAP WEIGHTED SURFACE ACOUSTIC WAVE TRANSDUCERS

BACKGROUND OF THE INVENTION

This invention relates to surface acoustic wave devices and, more particularly, to improved transducers for surface acoustic wave devices.

In recent years, surface acoustic wave (SAW) devices have been employed in an increasing number of practical applications such as filters and delay lines. In a typical SAW device, opposing "combs" of interdigitated metal fingers are disposed on a piezoelectric material and a surface acoustic wave can be induced in the material by electrically exciting the fingers or, conversely, an electrical signal can be induced across the fingers by a surface acoustic wave propagating in the piezoelectric material beneath the fingers. The geometrical configuration of the fingers is selected to yield desired electrical characteristics; for example, the spacing between fingers often being selected as a function of the primary wavelength to be propagated in the device. A technique known as "tap-weighting" is presently in widespread use, e.g. where the SAW is to be used for a bandpass, chirp or matched filter. In the most common form of tap-weighting, known as "apodization", the metal fingers of each comb vary in length by a factor of as much as 50. In other words, each comb may have many fingers of different lengths with the longest finger being of the order of 50 times the length of the shortest finger. This wide diversity in finger lengths, when properly designed, yields desirable characteristics, such as an effective frequency bandpass. However, tap-weighting techniques give rise to practical problems which limit their usefulness. One problem manifests itself in the size (and therefore, cost) of the SAW device using tap-weighted finger lengths. Specifically, since the shortest finger employed must have at least a certain minimum required length (as dictated to some degree by its width which is wavelength dependent and its minimum length with respect to width), it follows that the longest finger takes on a size which necessitates a relatively large overall device size. In the fabrication of SAW devices, manufacturing costs relate to device size, and the necessarily larger devices are therefore more expensive. A further problem with tap-weighting is that the amplitude profile of the generated surface acoustic wave, which obtains differing contributions from fingers of different lengths, is non-uniform.

It has been suggested that some of the above-identified problems could be solved by achieving tap-weighting by using a capacitor in series with the different fingers of each comb so that finger lengths would not have to be varied. In particular, the tap-weighting would be attained by employing different sized capacitors in series with the various fingers of the comb so as to get the desired weightings by virtue of the differing inpedances presented to the particular operating signal frequencies. However, this technique gives rise to a fundamental limitation in that the strength of a transducer tap cannot be varied without varying the tap delay.

A further existing problem of SAW devices is a result of the bi-directionality of conventional interdigitated transducers. In particular, when a transducer is excited with the intention of producing a surface acoustic wave propagating in a particular direction, a spurious surface acoustic wave propagating in the opposite direction is also generated. This results in signal loss and the generation of spurious signals, the reflection of which causes undesired interference. So-called "unidirectional" transducers have been devised and typically have electrodes consisting of finger triplets (rather than the finger pairs of conventional bi-directional transducer combs). The electrical excitation to the three fingers is appropriately phased such that the wave components add constructively in the desired propagation direction and interfere destructively in the opposite direction so that effective "unidirectional" operation is achieved. Generally, the finger triplets are components of three different combs with one of the combs geometrically opposing the other two combs. A serious problem arises on the side having the two combs since there is necessarily an overlap of conductors on this side. The result is an undesirable inter-conductor capacitance which causes an unbalanced condition and adversely affects the frequency response of the device.

It is an object of the present invention to provide an improved SAW transducer which, inter alia, is responsive to existing problems of the prior art and, in particular, provides solutions to the problems encountered in tap-weighting techniques and techniques for obtaining unidirectional operation.

SUMMARY OF THE INVENTION

The present invention is directed to a transducer for a surface acoustic wave device. In accordance with an embodiment of the invention, there is provided an acoustic wave propagating substrate and first and second spaced elongated conductive fingers disposed on the substrate. A layer of dielectric material is formed over the first and second fingers. A first electrode is formed on the dielectric layer above the first finger, the first electrode being proportioned to oppose a predetermined portion of the first finger. A second electrode is formed on the dielectric layer above the first finger, the second electrode being spaced from the first electrode and proportioned to oppose another predetermined portion of the first finger. A third electrode is formed on the dielectric layer above the second finger, the third electrode being proportioned to oppose a predetermined portion of the second finger. A fourth electrode is formed on the dielectric layer above the second finger, the fourth electrode being proportioned to oppose another predetermined portion of the second finger. A plurality of input/output (i.e., input or output) terminals are provided, and means are provided for coupling the input/output terminals to the electrodes.

In the preferred embodiment of the invention, further means are provided for coupling the first and fourth electrodes and for coupling the second and third electrodes. In this embodiment, the predetermined portion of the first finger substantially equals the predetermined portion of the second finger, and the another predetermined portion of the first finger substantially equals the another predetermined portion of the second finger. In operation of the transducer, the electrodes are capacitively coupled to the fingers in a manner such that voltage as between the fingers can be selected by appropriately selecting the predetermined portions and the another predetermined portions; i.e., the degree of overlap of the electrodes.

In an embodiment of the invention the transducer further comprises a conductor disposed on the substrate beneath the dielectric layer and auxiliary electrode means formed on the dielectric layer above the conductor. Means are provided for coupling the auxiliary electrode means to the second and fourth electrodes. In this embodiment, the plurality of input/output terminals comprises first, second and third terminals respectively coupled to the conductor, the first electrode, and the third electrode. When a three phase electrical signal is applied to the first, second and third terminals, the transducer serves as a unidirectional transducer which overcomes certain problems of the prior art.

Further features and advantages of the invention will become more readily apparent from the following detailed description when taken in conjunction with the accompanying drawings.

DESCRIPTION OF THE PREFERRED EMBODIMENT

Figure 1:
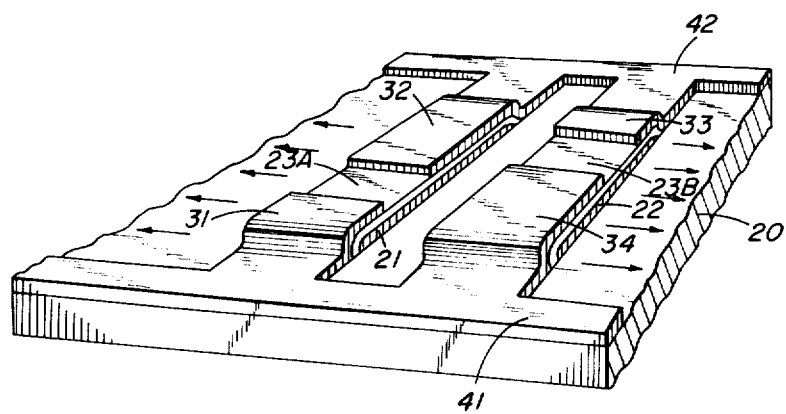
FIG. 1 is an elevational cutaway view of a transducer in accordance with an embodiment of the invention.

Referring to FIG. 1, there is shown an embodiment of a transducer for a surface acoustic wave device in accordance with the invention. A portion of an acoustic wave propagating substrate 20 is shown, the substrate typically comprising a piezoelectric medium such as lithium niobate. First and second spaced elongated conductive fingers, 21 and 22, are disposed on the substrate, preferably separated by ½ acoustic wavelength. As used herein, the term "disposed on the substrate" is intended to include any suitable mechanical coupling thereto, including coupling through an intermediate material or imbedding of the fingers in the substrate. A layer of dielectric material is formed over the fingers, and in the illustration of FIG. 1 it consists of oxide layer 23A covering the finger 21 and oxide layer 23B covering the finger 22. An overall dielectric layer 23 can be formed and later etched, as will be described, but it will be understood that a continuous layer could be utilized. (Illustration is facilitated by showing the oxide layer as having individual portions.) A first conductive electrode 31 is formed on the oxide layer 23A and overlaps and opposes a predetermined portion of the finger 21. A second conductive electrode 32 is also formed on the oxide layer 23A. The electrode 32 is spaced from the electrode 31 and is proportioned to overlap and oppose another predetermined portion of the finger 21. Third and fourth metal electrodes, labelled with reference numerals 33 and 34 respectively, are formed over the oxide layer 23B with electrode 33 overlapping and opposing a predetermined portion of the finger 22 and electrode 34 being spaced from electrode 33 and overlapping and opposing another predetermined portion of the finger 22. In the present embodiment, the relative overlaps of the electrodes 31 and 33 are substantially equal, and the relative overlaps of electrodes 32 and 34 are substantially equal. The electrodes 31 and 34 extend to and merge with a buss bar 41 which is substantially perpendicular to the electrodes and fingers. Similarly, the electrodes 32 and 33 extend to and are merged with a buss bar 42 which runs parallel to the buss bar 41.

Figure 2:
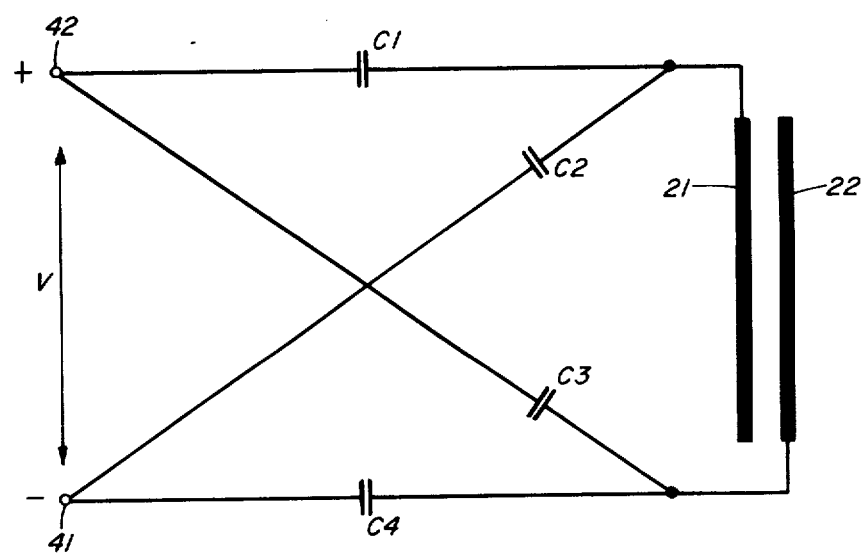
FIG. 2 is a simplified equivalent circuit of the transducer of FIG. 1.

Basic operation of the transducer of FIG. 1 can be understood by referring to FIG. 2 which represents a simplified equivalent circuit of FIG. 1. A voltage V is applied across a pair of terminals 42 and 41 which can be visualized as equivalent to the buss bars having the same reference numerals. The electrodes 31 and 32 are capacitively coupled to the finger 21, as is represented by the capacitors C2 and C1 in FIG. 2. Similarly, the electrodes 33 and 34 are capacitively coupled to the finger 22 as is represented by the capacitors C3 and C4 in FIG. 2. In the present embodiment, the electrodes 33 and 34 are proportioned such that $C4 = C1$ and $C3 = C2$. With a voltage applied across buss bars 41 and 42, the resultant voltage as between the fingers 21 and 22 is proportional to $V (C1 - C2)/C1 + C2$. Thus, by selecting the difference $C1 - C2$, which is achieved by selecting appropriate areas for the electrodes, the voltage across any finger pair, and thus the tap weight, can be controlled. This assumes that the sum $C1 + C2$ remains constant, which is readily achieved by maintaining a constant "gap" length between opposing electrodes (e.g. the exposed oxide area between the opposing edges of electrodes 31 and 32). The tap weighted transducer of the present invention has a number of distinct advantages. Since the fingers (such as 21 and 22 and any additional finger pairs in the transducer — not shown in FIG. 1) can all be made the same length, the acoustic beam will have uniform width. This tends to reduce diffraction errors caused by very narrow beam widths, simplifies the transducer model, and makes it possible to use two tap weighted transducers operating in conjunction with one another. In the preferred form of the present invention tap weighting is primarily a ratio of capacitive values and the absolute value of each capacitor has only second order significance. Thus, the tap weight is permanently set and is relatively insensitive to variations in dielectric constant with temperature or age. Further, the weights of the taps can be adjusted over a relatively wide dynamic range while controlling phase, due to the balanced capacitance setup.

Figure 3A:
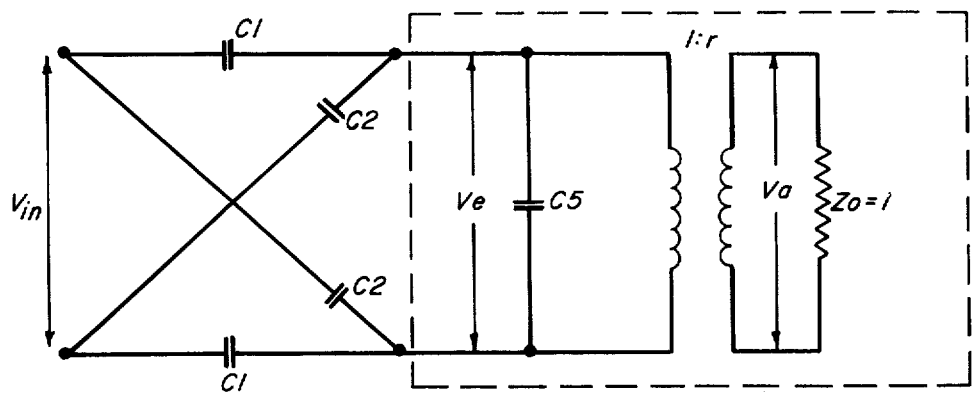
FIGS. 3A, 3B and 3C illustrate models useful in analyzing the transducer of FIG. 1.
Figure 3B:
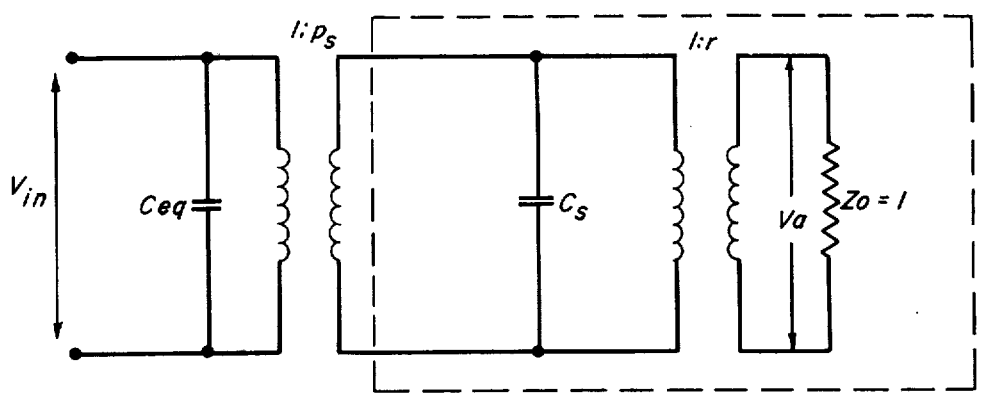
Figure 3C:
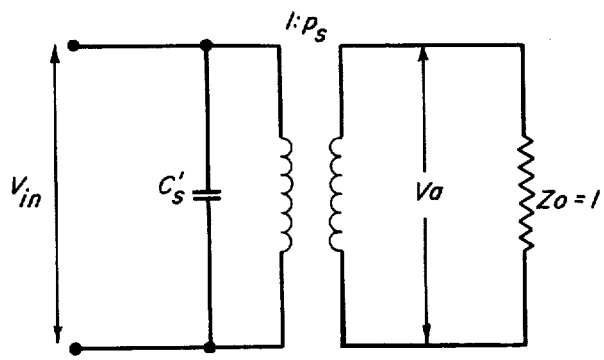

FIGS. 3A, 3B and 3C show models useful in analyzing the transducer. FIG. 3A shows the capacitor bridge network connected to a single finger pair using Mason's equivalent circuit model at center frequency for a single tap. $V_{IN}$ is the voltage applied to the buss bars and $V_c$ is the reduced voltage applied to the tap. FIG. 3B is an equivalent model reducing the bridge network to an equivalent capacitance and a transformer with a turns ratio of $p_s$. FIG. 3C is a further simplified model which is identical to Mason's model except $C_s$ becomes $C_s'$ and the turns ratio is changed from $r$ to $rp_s$ for a single tap.

The lower fingers for every tap are the same length producing a uniform beam. Because of the constant lengths $C_s$ and $r^2$ (where $r^2 = 4\pi^{-1}\omega C_s k^2$ with $\omega =$ the angular frequency and $k^2 =$ the coupling coefficient of the piezoelectric substrate) are constant. The sum of the series capacitances C1 and C2 is designated $C_s$ and this sum is constant for every tap. The ratio $C_s/C_T$ is defined as $\alpha_r$, which is also a constant for every tap. Also, define:

$$\alpha_w = \frac{C_1 - C_2}{C_1 + C_2} = \frac{\Delta C}{C_T}.$$

$\alpha$ will vary from tap to tap depending on the ratio of $\Delta C$ to $C_T$.

One of the effects of the present technique is to raise the input capacitance, which is a function of $\alpha_w$ and defined as:

$$C_s'(\alpha_w) = \frac{\kappa^2}{2}(1 + 2\alpha_r)(1 + 2\alpha_r - \alpha_w^2)C_T$$

where $$C_s'(\alpha_w = 1) = \kappa^2 \alpha_r (1 + 2\alpha_r) C_T = C_s'(\text{min})$$

and $$C_s'(\alpha_w = 0) = \frac{\kappa^2}{2}(1 + 2\alpha_r)^2 C_T = C_s'(\text{max}).$$

Therefore, $$C_s'(\alpha_w) = C_s'(\alpha_w = 0)\left[1 - \frac{\alpha_w^2}{(1 + 2\alpha_r)}\right]$$

The maximum overall coupling coefficient is given by $$\kappa^2 = \frac{1}{[(4 + 16\pi^{-2}k^4)\alpha_r^2 + 4\alpha_r + 1]}$$

Therefore, for a given piezoelectric material and fixed $\alpha_r$, the maximum overall coupling coefficient is $\kappa^2 r^2$ where $\kappa^2$ and $r^2$ are constants.

It is now possible to define the single tap capacitive turns ratio given by:

$$\rho_s = \alpha_w \kappa$$

and the overall turns ratio as $$r\rho_s = r\kappa\alpha_w$$

Since both $r$ and $\kappa$ are constants for every tap, the turns ratio for each tap can be varied by changing $\alpha_w$. It is clear, then, that $\alpha_w$ is the adjustable tap weight. In a conventional apodized transducer the tap weight is varied by changing the degree to which fingers oppose each other, but for the present transducer the tap weight is determined by the difference of C2 and C1 divided by the sum thereof. With $C_T$ held constant, each value of $\Delta C$ yields a unique tap weight over a relatively wide dynamic tap range and the tap delay variation remains constant over the tap range. The tap delay is given by:

$$\tau_D = \frac{4\pi^{-1}k^2\alpha_r}{\omega(1 + 2\alpha_r)}$$

Since $k^2$ and $\alpha_r$ are both constants, the transducer does not introduce any tap delay variation in the impulse response due to the capacitor network.

The analysis indicates that the transducer has a relatively wide dynamic tap range, no tap delay errors, a reduced coupling coefficient and, in general, a higher input capacitance. For a conventional apodized transducer the tap capacitance is directly proportional to tap weight. However, for the present tap the input capacitance increases as the tap weight decreases.

Figure 4:
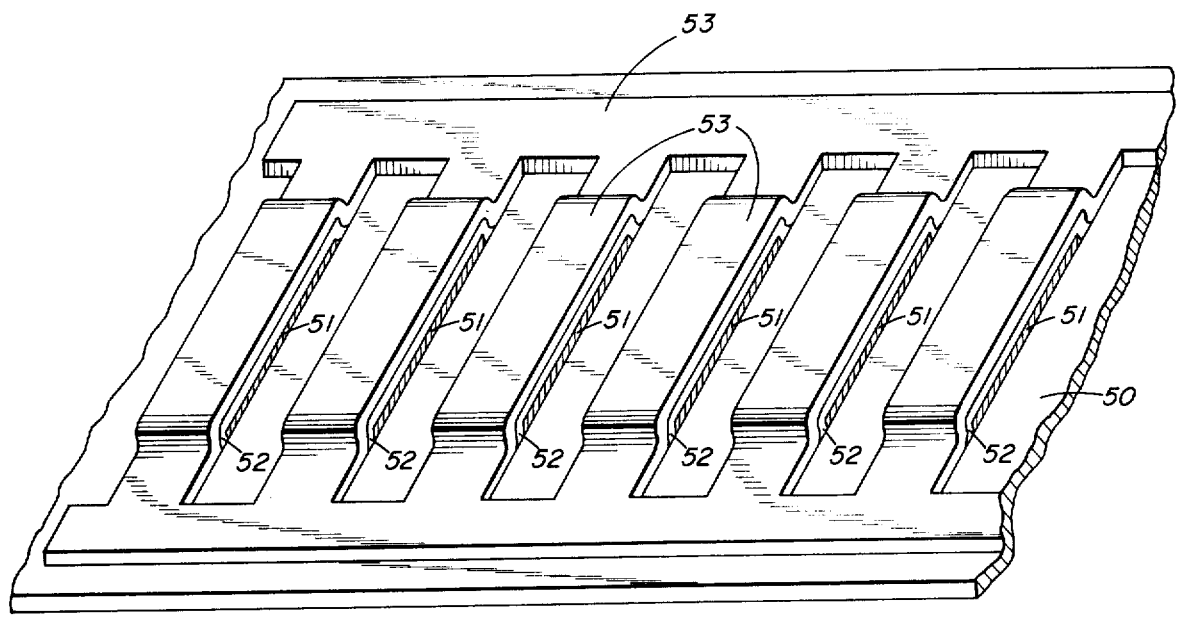
FIG. 4 illustrates a "universal blank" structure from which a tap weighted transducer in accordance with the invention can be fabricated.
Figure 5:
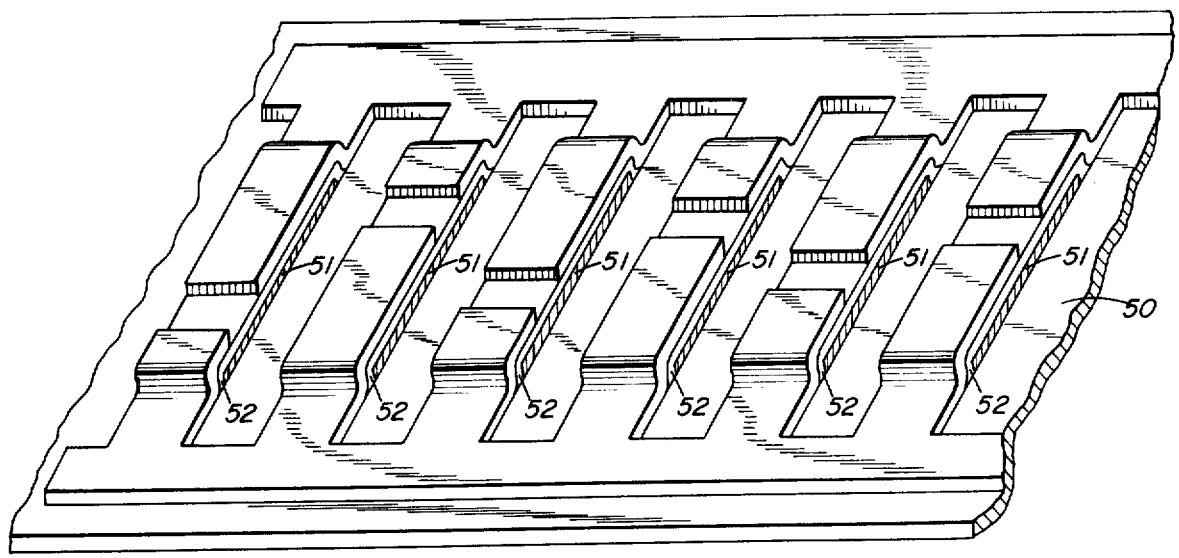
FIG. 5 shows a tap weighted transducer in accordance with an embodiment of the invention.

The transducer of the invention is a multilayered device and can be fabricated such as by using a three mask process. For example, lower aluminum fingers 51 can be produced on a piezoelectric substrate 50 using a first mask. The fingers are all preferably of equal length to obtain a uniform acoustic beam. Next, a $SiO_x$ layer 52 is deposited to the desired thickness using standard evaporation techniques. An aluminum layer 53 is evaporated over the $SiO_x$ and the upper electrodes are etched using a second mask. The dielectric thickness and electrode area determine the capacitance, $C_T$. The upper electrodes lie directly above the lower fingers, separated by the dielectric layer. FIG. 4 shows the structure at this point in the fabrication process at which it is called a "universal blank." It is so named because the weighting has not yet been determined. Therefore, for example, two filters requiring the same tap separation but different tap weights could be made from the same universal blank. The tap weights are determined by opening the upper electrodes at prescribed positions using a third mask. For example, photoresist can be placed over the blank and then selectively exposed using the third mask. This leaves holes in the photoresist which allows an aluminum etch to open holes in the upper electrodes at the desired positions. The holes could also be opened by alternate techniques such as laser trimming. FIG. 5 shows a device fabricated with three different tap weights.

Figure 6:
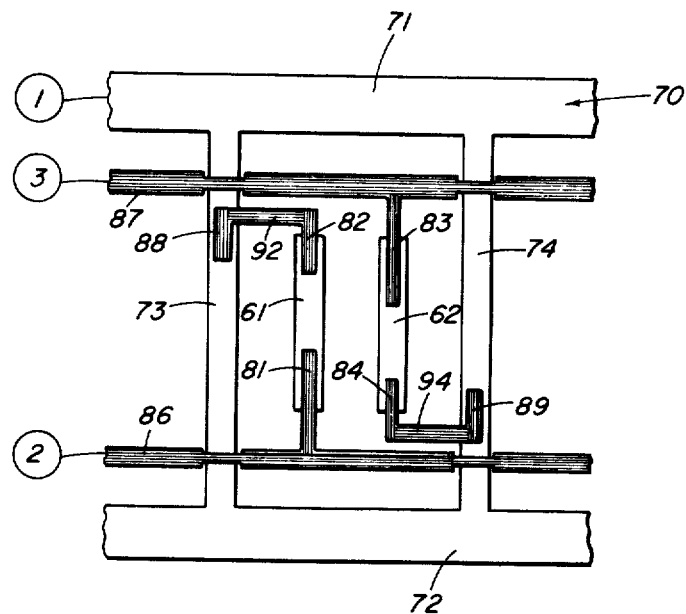
FIG. 6 is a plan view of an embodiment of the invention utilized to obtain unidirectional operation.

Referring to FIG. 6, there is shown a plan view of an embodiment wherein the principles of the invention are utilized to obtain a unidirectional transducer. All elements shown in the FIG. are conductors. The clear portions represent lower conductors disposed on the piezoelectric substrate and the shaded portions represent upper conductors disposed over the dielectric layer which is, in turn, disposed over the lower conductors (as in the previous description). A first elongated conductive finger 61 and a second elongated conductive finger 62 are disposed on the substrate. A conductor 70, having buss bars 71 and 72 and branches 73 and 74, is also disposed on the substrate, the branches 73 and 74 being substantially parallel to the fingers 61 and 62. As in FIG. 1, first, second, third and fourth electrodes, designated by reference numerals 81, 82, 83 and 84, respectively, overlap the fingers 61 and 62 by different amounts. Electrode 81 is coupled to a buss bar 86 and electrode 83 is coupled to a buss bar 87. The buss bars 86 and 87 overlap the branches 73 and 74 of the conductor 70 and preferably narrow at the overlap junctions, as shown, to minimize interelectrode capacitance. Auxiliary electrodes 88 and 89 are disposed on the dielectric layer above the conductor branches 73 and 74, respectively, and are coupled to the electrodes 82 and 84, respectively, by conductors 92 and 94. (The conductive combinations 82, 92, 88 and 84, 94, 89 are each preferably integrally formed units.) A three phase signal is applied to the buss bars 71, 86 and 87 via the terminals designated 1, 2 and 3 which correspond to the phase 1, phase 2 and phase 3 signals in the subsequent description. Various techniques for generating suitable three phase signals are known in the art and disclosed, for example, in an article entitled "Unidirectional Acoustic Surface Wave Filters with 2 dB Insertion Loss" which appeared in the IEEE 1974 Ultrasonics Symposium Proceedings at page 425.

Figure 7:
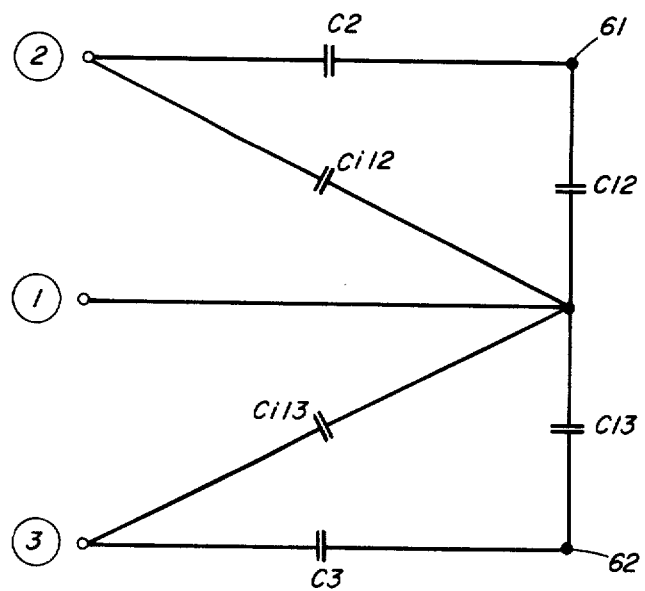
FIG. 7 is a simplified circuit model of the transducer of FIG. 6.

Operation of the transducer of FIG. 6 can be better understood from the simplified circuit model shown in FIG. 7. The capacitor designated $C_2$ represents the capacitance as between electrode 81 and finger 61 while the capacitor designated $C_3$ represents the capacitance as between electrode 83 and finger 62. The capacitor designated $C_{12}$ represents two capacitances in series; viz., the capacitance as between branch 73 and auxiliary electrode 88 in series with the capacitance as between electrode 82 and finger 61. Similarly, the capacitor designated $C_{13}$ represents two capacitances in series; viz., the capacitance as between branch 74 and auxiliary electrode 89 in series with the capacitance as between electrode 84 and finger 62. The voltages on fingers 61 and 62 can accordingly be set in the manner described in conjunction with FIG. 1 by selecting the effective capacitor areas and, thus, the capacitance values. The capacitors designated $C_{112}$ and $C_{113}$ respectively represent the interbuss-bar capacitances as between the buss bar 86 and conductors 73 and 74 and the interbuss-bar capacitance as between the buss bar 87 and the conductors 73 and 74. The capacitances caused by these crossovers are seen to be balanced, unlike prior art attempts at attaining unidirectional operation.

The invention has been described with reference to particular embodiments but variations within the spirit and scope of the invention will occur to those skilled in the art. For example, it will be understood that a plurality of unidirectional transducer elements, of desired characteristics, can be arranged in a row.

We claim:

1. A transducer for a surface acoustic wave device comprising:
    an acoustic wave propagating substrate;
    first and second spaced elongated conductive fingers disposed on said substrate;
    a layer of dielectric material formed over said first and second fingers;
    a first electrode formed on the dielectric layer above said first finger, said first electrode being proportioned to oppose a predetermined portion of said first finger;
    a second electrode formed on the dielectric layer above said first finger, said second electrode being spaced from said first electrode and being proportioned to oppose another predetermined portion of said first finger;
    a third electrode formed on the dielectric layer above said second finger, said third electrode being proportioned to oppose a predetermined portion of said second finger;
    a fourth electrode formed on the dielectric layer above said second finger, said fourth electrode being proportioned to oppose another predetermined portion of said second finger;
    a plurality of input/output terminals; and
    means for coupling said input/output terminals to said electrodes.

2. A transducer as defined by claim 1 further comprising means for coupling said first and fourth electrodes and means for coupling said second and third electrodes.

3. A transducer as defined by claim 1 wherein said predetermined portion of said first finger substantially equals said predetermined portion of said second finger and said another predetermined portion of said first finger substantially equals said another predetermined portion of said second finger.

4. A transducer as defined by claim 2 wherein said predetermined portion of said first finger substantially equals said predetermined portion of said second finger and said another predetermined portion of said first finger substantially equals said another predetermined portion of said second finger.

5. A transducer as defined by claim 1 wherein said acoustic wave propagating substrate comprises a piezoelectric substrate.

6. A transducer as defined by claim 4 wherein said acoustic wave propagating substrate is a piezoelectric substrate.

7. A transducer as defined by claim 1 further comprising:
    a conductor disposed on said substrate beneath said dielectric layer;
    auxiliary electrode means formed on said dielectric layer above said conductor; and
    means for coupling said auxiliary electrode means to said second and fourth electrodes.

8. A transducer as defined by claim 7 wherein said plurality of input/output terminals comprises first, second and third terminals respectively coupled to said conductor, said first electrode, and said third electrode.

9. A transducer as defined by claim 8 further comprising means for applying a three phase electrical signal to said first, second and third terminals.

10. A transducer as defined by claim 7 wherein said conductor comprises a plurality of branches surrounding said fingers and wherein said auxiliary electrode means comprises first and second auxiliary electrodes disposed above different branches of said conductor.

11. A transducer as defined by claim 7 wherein said acoustic wave propagating substrate comprises a piezoelectric substrate.

12. A transducer as defined by claim 9 wherein said acoustic wave propagating substrate is a piezoelectric substrate.

13. A transducer as defined by claim 10 wherein said plurality of input/output terminals comprises first, second and third terminals respectively coupled to said conductor, said first electrode, and said third electrode.

14. A transducer as defined by claim 13 wherein said acoustic wave propagating substrate is a piezoelectric substrate.

15. A transducer for a surface acoustic wave device comprising:
    an acoustic wave propagating substrate;
    a plurality of spaced elongated conductive fingers disposed on said substrate;
    a layer of dielectric material formed over said fingers;
    a first comb comprising a plurality of coupled electrodes respectively formed on the dielectric layer above said plurality of fingers, each of said electrodes overlapping a portion of a respective finger;
    a second comb comprising a plurality of coupled electrodes respectively formed on the dielectric layer above said plurality of fingers, each of said electrodes overlapping another portion of a respective finger;
    a plurality of input/output terminals; and
    means for coupling said input/output terminals to said first and second combs.

16. A transducer as defined by claim 15 wherein various electrodes of said first comb overlap different portions of their respective fingers and various electrodes of said second comb overlap different another portions of their respective fingers.

17. A transducer as defined by claim 16 wherein said acoustic wave propagating substrate is a piezoelectric substrate.

* * * * *